(12) United States Patent
Bortolini et al.

(10) Patent No.: US 6,938,678 B1
(45) Date of Patent: Sep. 6, 2005

(54) ARRANGEMENT FOR LIQUID COOLING AN ELECTRICAL ASSEMBLY USING ASSISTED FLOW

(75) Inventors: James R. Bortolini, Broomfield, CO (US); Scott E. Farleigh, Denver, CO (US); Gary J. Grimes, Birmingham, AL (US); Jean S. Nyquist, Denver, CO (US); Charles J. Sherman, Westminster, CO (US)

(73) Assignee: Lucent Technologies Inc., Murray Hill, NJ (US)

( * ) Notice: Subject to any disclaimer, the term of this patent is extended or adjusted under 35 U.S.C. 154(b) by 659 days.

(21) Appl. No.: 09/602,037

(22) Filed: Jun. 23, 2000

(51) Int. Cl.⁷ ............................................. H05K 7/20
(52) U.S. Cl. .................... 165/80.4; 257/714; 361/699; 417/436
(58) Field of Search ................ 165/80.4; 257/714; 361/699, 695; 417/436, 410.1

(56) References Cited

U.S. PATENT DOCUMENTS

| | | | | |
|---|---|---|---|---|
| 4,302,793 A | * | 11/1981 | Rohner ........................ 361/699 |
| 4,498,851 A | * | 2/1985 | Kolm et al. ............ 417/436 X |
| 4,684,328 A | * | 8/1987 | Murphy .................. 417/436 X |
| 4,780,062 A | * | 10/1988 | Yamada et al. ......... 417/436 X |
| 4,805,420 A | * | 2/1989 | Porter et al. ............ 361/699 X |
| 4,834,619 A | * | 5/1989 | Walton .................... 417/436 X |
| 4,891,688 A | * | 1/1990 | Longerich .................. 257/714 |
| 5,008,582 A | * | 4/1991 | Tanuma et al. .......... 417/436 X |
| 5,380,956 A | * | 1/1995 | Loo et al. ................ 257/714 X |
| 5,597,292 A | | 1/1997 | Rhee et al. |
| 5,871,336 A | * | 2/1999 | Young ......................... 417/207 |
| 5,901,037 A | * | 5/1999 | Hamilton et al. ............ 361/699 |
| 5,914,856 A | * | 6/1999 | Morton et al. .......... 361/695 X |
| 5,991,153 A | * | 11/1999 | Heady et al. ................ 361/695 |
| 6,052,284 A | * | 4/2000 | Suga et al. .................. 361/699 |
| 6,304,447 B1 | * | 10/2001 | Bortolini et al. ............. 361/699 |

FOREIGN PATENT DOCUMENTS

| | | | | |
|---|---|---|---|---|
| DE | 4121545 A1 | * | 1/1993 | ................. 361/704 |
| WO | 28961 | * | 7/1998 | ................. 361/695 |

* cited by examiner

Primary Examiner—Leonard R. Leo

(57) ABSTRACT

An arrangement for cooling an electronic assembly includes a circuit board, an enclosure member and at least one electromechanical actuator. The circuit board has a first surface, a second surface, and at least a first heat-generating element secured to the first surface. The circuit board further comprises at least one aperture extending between the first surface and the second surface. The enclosure member is secured to the circuit board so as to form a fluid tight barrier of a compartment defined at least in part by the enclosure member. The compartment includes a first subcompartment defined at least in part by the first surface and the enclosure member and a second subcompartment defined at least in part by the second surface and the enclosure member. The at least one electromechanical actuator is secured within the fluid type barrier and is operable to generate a flow movement in the direction of the at least one aperture when liquid is disposed in the fluid tight barrier.

8 Claims, 10 Drawing Sheets

ARRANGEMENT FOR LIQUID COOLING AN ELECTRICAL ASSEMBLY USING ASSISTED FLOW

FIELD OF THE INVENTION

The present invention relates generally to arrangements for cooling electronic assemblies, and more particularly, to arrangements for liquid-cooling such assemblies.

BACKGROUND OF THE INVENTION

Electronic assemblies which include a circuit board having a plurality of electronic components attached thereto are widely used in the communications industry to manage the flow of data on a telecommunications network. These electronic assemblies must be able to manage a high data rate over significant periods of time (e.g., months) without any maintenance. One problem encountered with these electronic assemblies, as well as other types of electronic assemblies, is that their high speed operations generate a significant amount of heat which can be detrimental to the electronic assemblies and thus cause maintenance problems. As a result, these electronic assemblies must be cooled constantly in order to maintain acceptable operating temperatures to avoid maintenance problems.

Several different approaches have been utilized in an attempt to address the aforementioned cooling requirement. For example, one approach employs assisted cooling techniques to maintain the electronic assembly within acceptable temperature limits. These assisted cooling techniques typically involve externally-powered cooling devices, such as fans. In a telecommunication central office switch, large fans are employed to provide the necessary cooling to the electronic assemblies. However, the use of assisted cooling techniques are discouraged by the communications industry because assisted cooling techniques can introduce a hazard to technicians working in the area. For example, the use of large fans can undesirably create a hazardous noise level. In addition, the types of fans used in assisted cooling tend to break down and thus increase the maintenance problems associated with servicing the telecommunications network.

Another approach utilizes a liquid to cool the electronic components attached to the circuit board. While liquid cooling improves the rate at which heat is dissipated from the various electronic devices, there is a need to improve the heat dissipation rates currently achievable without adding significant bulk to the overall assembly.

SUMMARY OF THE INVENTION

The present invention fulfills the above needs, as well as others, by providing an arrangement for cooling an electrical assembly that includes a circuit board at least partly disposed in a fluid tight compartment formed by an enclosure. The circuit board divides the compartment into first and second subcompartments. The circuit board includes at least one mechanical actuator that assists the flow of liquid from one subcompartment to another through at least one aperture in the circuit board. The assisted flow of liquid through the aperture allows liquid that has been heated from one or more electrical components in one subcompartment to flow to another compartment. Such flow of the heated liquid increases the liquid's ability to dissipate the heat.

In one embodiment of the present invention, an arrangement for cooling an electronic assembly includes a circuit board, an enclosure member and at least one electromechanical actuator. The circuit board has a first surface, a second surface, and at least a first heat-generating element secured to the first surface. The circuit board further comprises at least one aperture extending between the first surface and the second surface. The enclosure member is secured to the circuit board so as to form a fluid tight barrier of a compartment defined at least in part by the enclosure member. The compartment includes a first subcompartment defined at least in part by the first surface and the enclosure member and a second subcompartment defined at least in part by the second surface and the enclosure member. The at least one electromechanical actuator is secured within the fluid type barrier and is operable to generate a flow movement in the direction of the at least one aperture when liquid is disposed in the fluid tight barrier.

The electromechanical actuator as used in the above arrangement accelerates the fluid flow between the first subcompartment and the second subcompartment. Thus, for example, if the first subcompartment includes more heat-generating components, such as the first electronic component, then the heat generated within the first subcompartment may be conveyed to the cooler second subcompartment via the liquid flow through the aperture.

The above described features and advantages, as well as others, will become more readily apparent to those of ordinary skill in the art by reference to the following detailed description and accompanying drawings.

DETAILED DESCRIPTION

Figure 1:
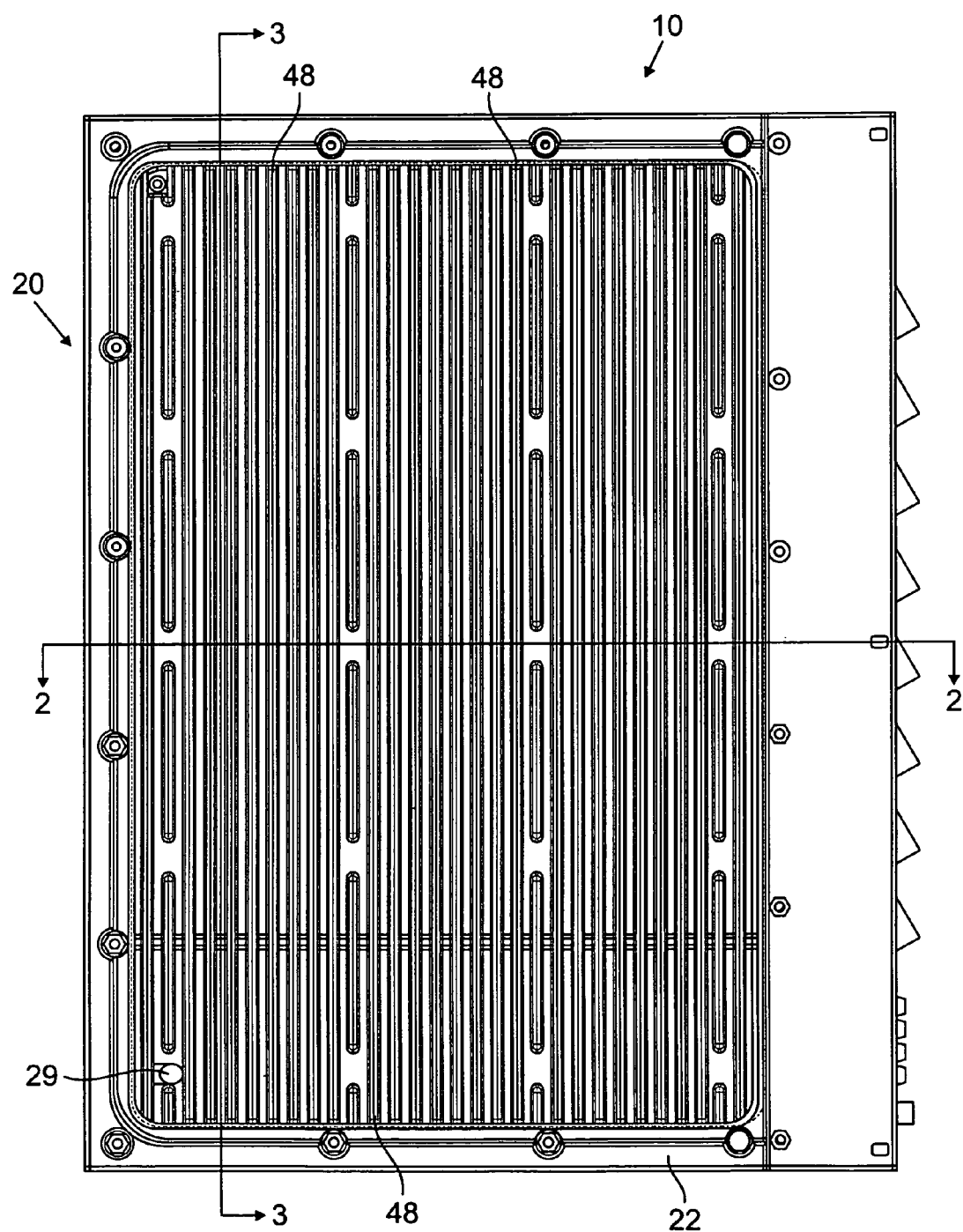
FIG. 1 shows a side elevational view of an arrangement for cooling an electronic assembly which incorporates the features of the present invention therein.
Figure 2:
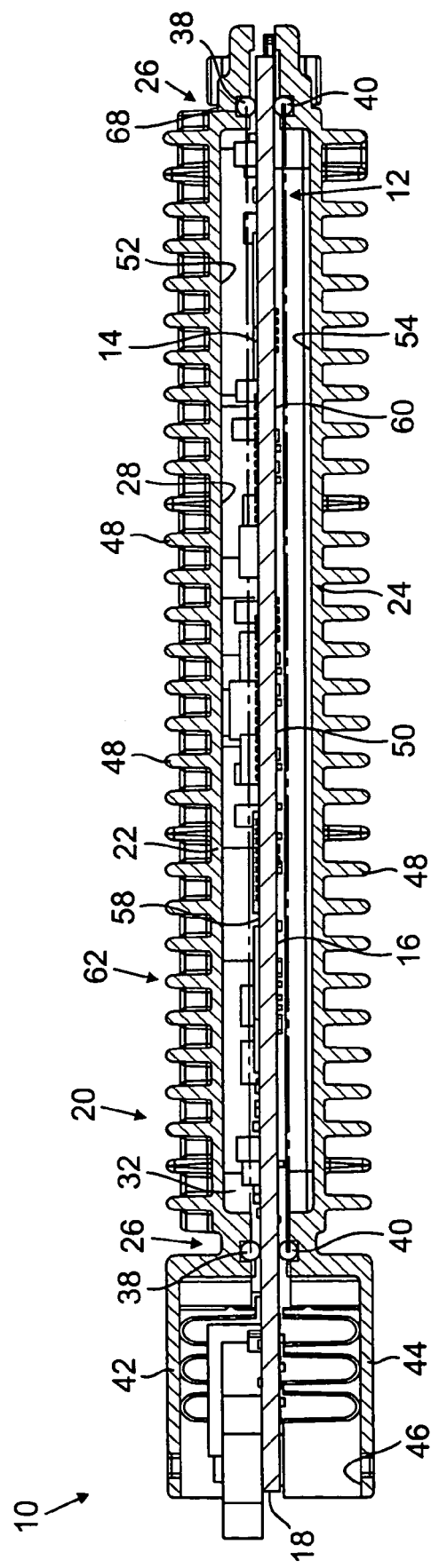
FIG. 2 is a cross sectional view of the arrangement of FIG. 1 taken along the line 2—2 as viewed in the direction of the arrows.
Figure 3:
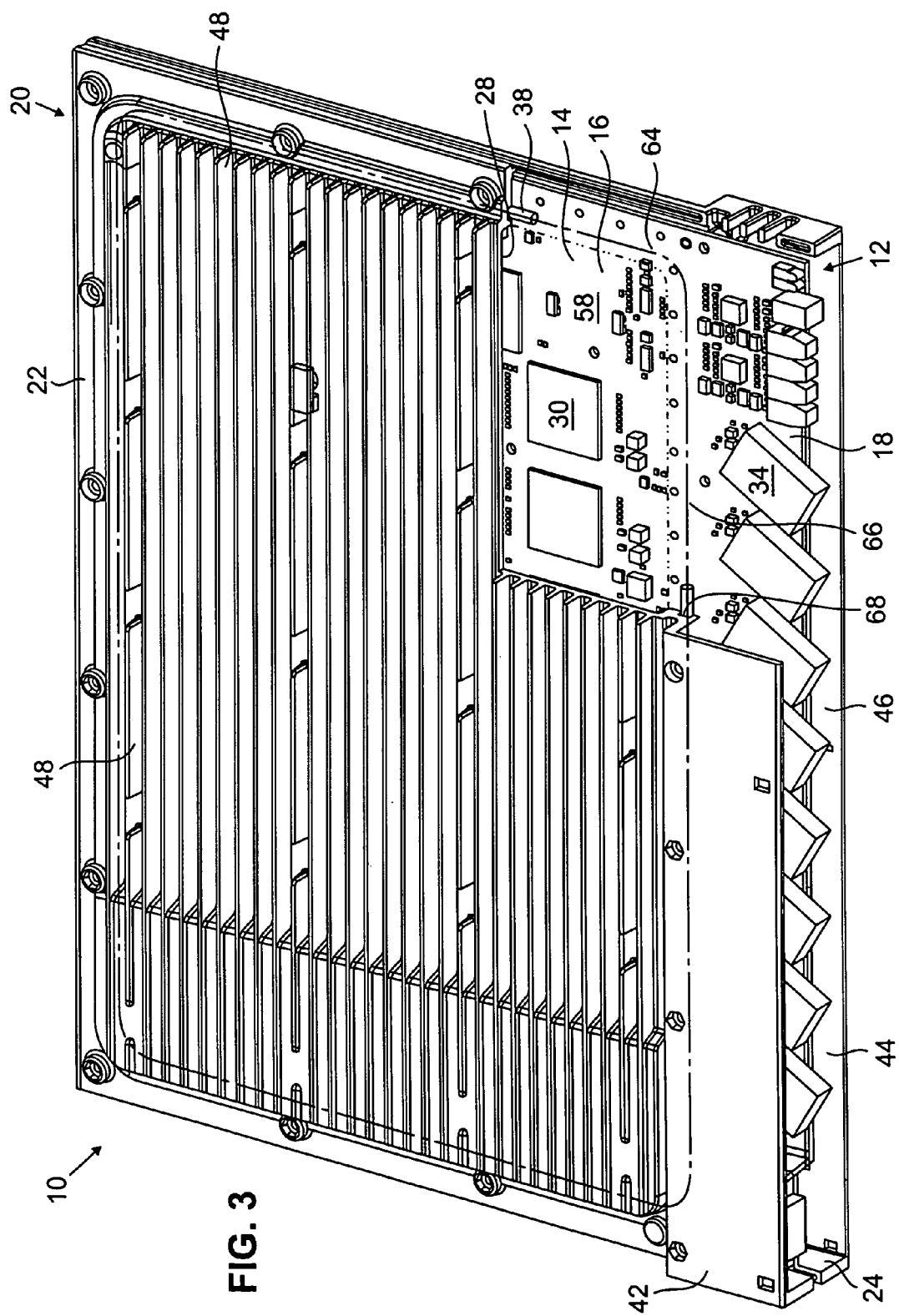
FIG. 3 is a perspective fragmentary view of the arrangement of FIG. 1.
Figure 4:
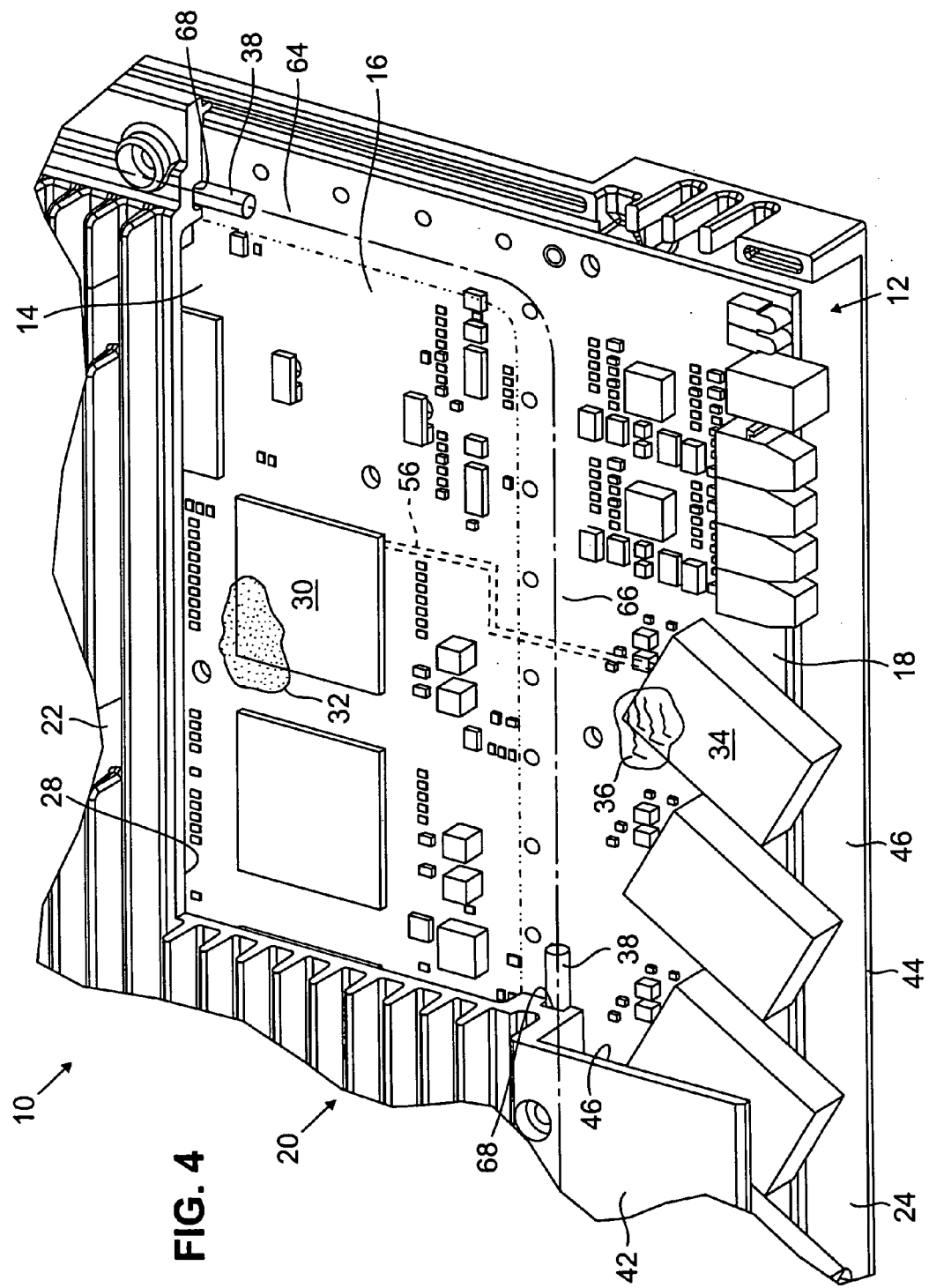
FIG. 4 is an enlarged view of a portion of FIG. 3.
Figure 5:
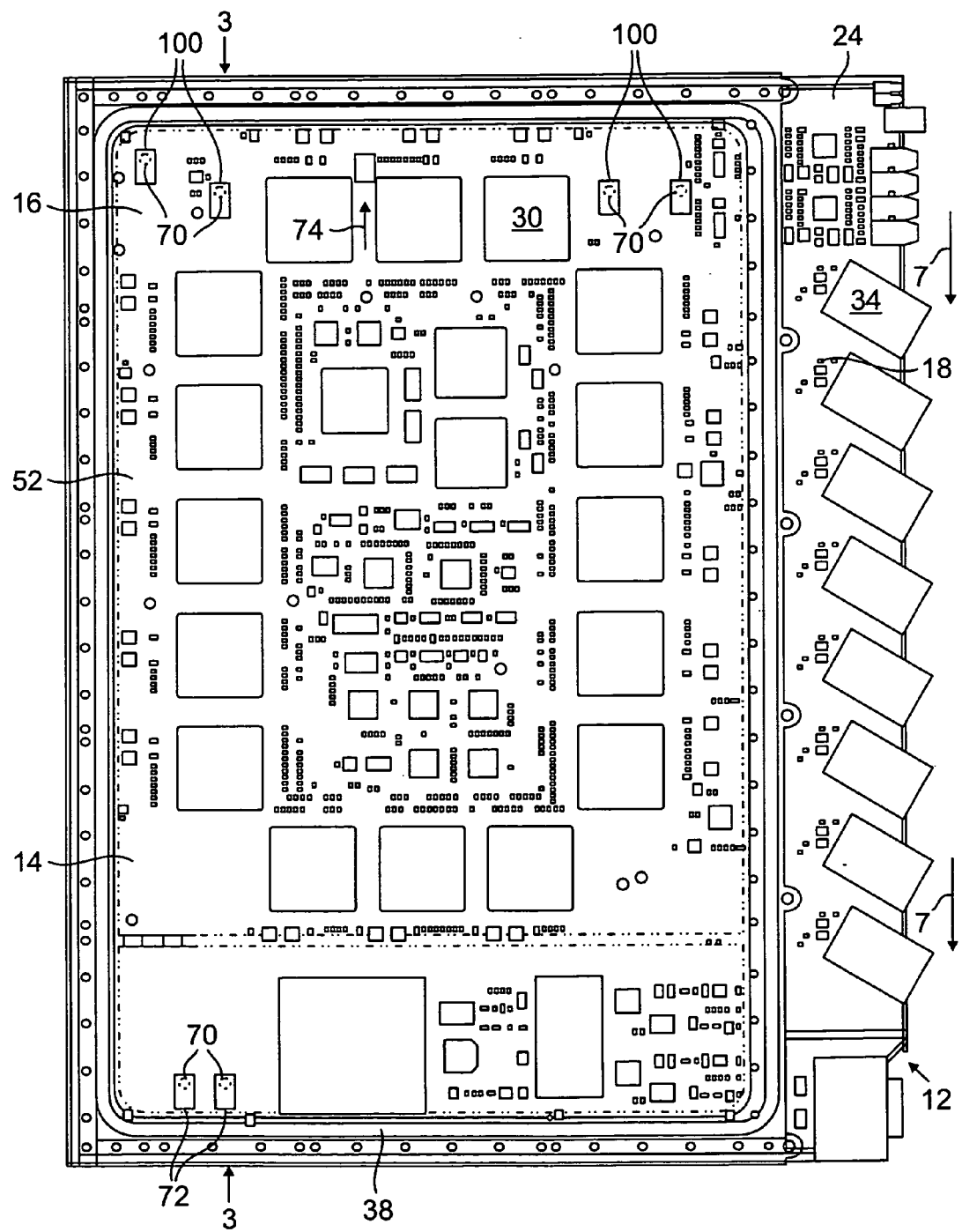
FIG. 5 is a view similar to the one shown in FIG. 1, but showing the first enclosure member removed for clarity of description.

Referring to FIGS. 1, 2, 3, 4, 5, 6, 7A and 7B there is shown an exemplary arrangement 10 for cooling an electronic assembly 12 which incorporates the features of the present invention therein. The arrangement 10 includes an enclosure member 20, a circuit board 14 and at least one electromechanical actuator, shown in FIGS. 3 and 4 as plural electromechanical actuators 100. In accordance with the present invention, the circuit board 14 includes at least one aperture, shown by way of example as the upper apertures 70, for facilitating liquid flow from a first subcompartment 52 to a second subcompartment 54 to assist in cooling of electrical components on the circuit board 14 (see generally FIG. 6). As illustrated in FIGS. 3, 4 and 5, the apertures 70 are hidden from view by portions of the electromechanical actuators 100.

In general, the plurality of electronic components includes switching devices, power management devices, filter devices, memory devices, and processor devices. However, hereinafter, only a first electronic component 30 and a second electronic component 34 will be discussed in detail for clarity of description. In the exemplary embodiment described herein, the arrangement 10 further includes a fluid or liquid 32, a gas 36, a first sealing member 38, a second sealing member 40, a first wall segment 42, a second wall segment 44, and a plurality of fins 48.

The enclosure member 20 includes a first plate member 22, a second plate member 24, a plurality of fins 48, first and second wall segments 42 and 44, and at least one sealing member channel 68. The plurality of fins 48 extend perpendicularly from each of the first and second plate members 22 and 24. The first wall segment 42 extends from one edge of the plate member 22 and the second wall segment 44 extends from the second plate member 24. The sealing member channel 68 is disposed at the periphery of the first plate member 22, and is in part disposed between the first plate member 22 and the first wall segment 42. In a substantially identical manner, a sealing member channel is also disposed at the periphery of the second plate member 24.

It is noted that the embodiment described has an additional advantage of including a portion of the circuit board 14 that is not liquid cooled, which may be used to house elements that are not amenable to liquid cooling. To this end, the circuit board 14 in the exemplary embodiment described herein includes a primary circuit board portion 16 and a secondary circuit board portion 18 integrally secured to the primary circuit board portion 16. The primary circuit board portion 16 is liquid cooled and the second circuit board portion 18 that contains elements that are not amenable (i.e. have significantly reduced functionality) to liquid cooling.

In particular, the circuit board 14 also has a first surface 58 and a second surface 60 defined thereon. The primary circuit board portion 16 includes at its periphery a sealing member location 64 defined on first surface 58. The primary circuit board portion 16 also has a sealing member location (not shown) defined on the second surface 60 which is substantially identical to the sealing member location 64. As shown more clearly in FIG. 4, a segment 66 of the sealing member location 64 is interposed between the primary circuit board portion 16 and the secondary circuit board portion 18. In a similar manner, a segment (not shown) of the sealing member location (not shown) defined on the second surface 60 is interposed between the primary circuit board portion 16 and the secondary circuit board portion 18.

As shown more clearly in FIGS. 2 and 4, the first sealing member 38 is positioned on the sealing member location 64 of the primary circuit board portion 16. The first plate member 22 is then positioned relative to the circuit board 14 such that the first sealing member 38 is (i) positioned within the sealing member channel 68 and (ii) interposed between the primary circuit board portion 16 and the first plate member 22. The first sealing member 38 may suitably be a rubber gasket having, for example, a circular cross section when uncompressed. The first sealing member 38 should be chemically resistant to the liquid coolant that is employed within the arrangement 10 as discussed further below.

The second sealing member 40 is substantially identical to the first sealing member 38. The second sealing member 40 is positioned on the sealing member location (not shown) defined on the second surface 60 in a similar manner as that described above for the first sealing member 38. The second plate member 24 is then positioned relative to the circuit board 14 such that the second sealing member 40 is (i) positioned within the sealing member channel defined in the second plate member 24 and (ii) interposed between the primary circuit board portion 16 and the second plate member 24.

Once the first plate member 22, the first sealing member 38, the circuit board 14, the second sealing member 40, and the second plate member 24 are positioned in the above described manner, the first plate member 22 and the second plate member 24 are secured together and to the circuit board 14 via a number of fasteners (e.g., screws) inserted through holes defined in the first plate member 22, the second plate member 24, and the circuit board 14.

It should be understood that positioning and securing the first plate member 22, the first sealing member 38, the circuit board 14, the second sealing member 40, and the second plate member 24 in the above described manner results in the enclosure member 20 and the primary circuit board portion 16 cooperating so as to create a fluid tight barrier 26 of a compartment 28. In particular, the first plate member 22, the first sealing member 38, the primary circuit board portion 16, the second sealing member 40, and the second plate member 24 cooperate so as to create the fluid tight barrier 26 of the compartment 28.

Figure 6:
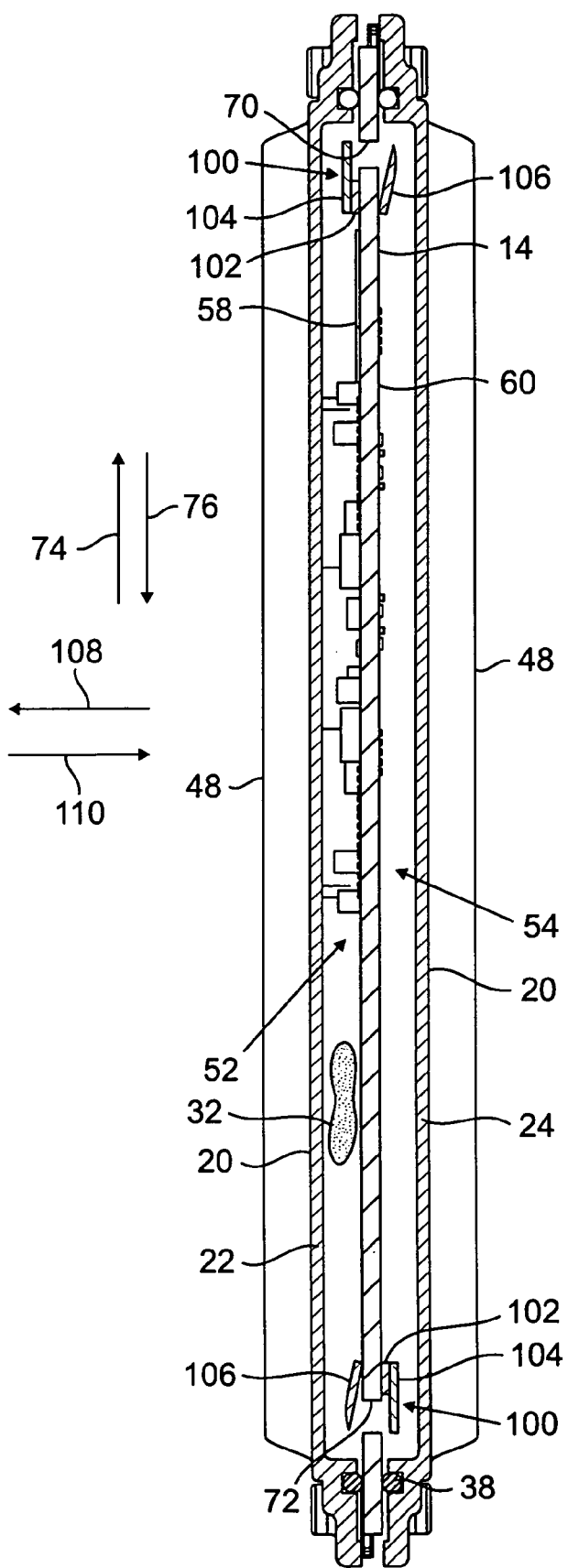
FIG. 6 is a cross sectional view of the arrangement of FIG. 1 taken along section 3—3.

It should be appreciated that the above described arrangement of the aforementioned components locates the primary circuit board portion 16 within the compartment 28 such that the primary circuit board portion 16 defines a partition 50 which divides compartment 28 into a first subcompartment 52 and a second subcompartment 54 as shown in FIG. 2. It is noted that the liquid 32 is shown in FIGS. 4 and 6 symbolically by a representative portion thereof. It will be noted, however, that the liquid is typically dispersed throughout the compartment 32.

As shown in FIG. 5, the primary circuit board portion 16 has a number of upper apertures 70 defined therein and a number of lower apertures 72 defined therein. The upper apertures 70 and the lower apertures 72 allow fluid communication between the first subcompartment 52 and the second subcompartment 54 of the compartment 28. The upper apertures 70 are located above the lower apertures 72 and are preferably located proximate the upper end of the circuit board 14. By "proximate the upper end", it is meant that the upper apertures are located closer to the upper end than the lower end. Likewise, it is preferable that the lower apertures 72 are located proximate the lower end of the circuit board 14.

In the exemplary embodiment described herein, an electromechanical actuator 100 is disposed proximate to at least one of the upper apertures 70 and at least one of the lower apertures 72. Each of the electromechanical actuators 100 includes a piezoelectric actuator 102, a blade 104 and a flapper valve 106. Each of the electromechanical actuators 100 is disposed within the fluid tight barrier 26 such that the piezoelectric actuator 102 and the blade 104 are located in one of the first and second subcompartments 52 and 54 and the flapper valve 106 is located in the other of the first and second subcompartments 52 and 54.

In the exemplary embodiment describe in connection with FIGS. 1, 2, 3, 4, 5, 6, 7A and 7B, the blade 104 has a substantially rigid structure. The piezoelectric actuator 102 may be any well known device that alters its shape in response to the application of an electric field thereto. For example, the piezoelectric device may be one of the piezoelectric crystals or transducers available from American Piezo Ceramics, Inc., of Mackeyville Pa. 17750. The blade 104 is secured to the piezoelectric actuator 102 such that the alteration of shape of the piezoelectric actuator 102 due to application of an electric field thereto causes transverse motion of the blade 104. The flapper valve 106 is preferably a semi-flexible or flexible member having a width and length that is at least on the order of the diameter of one of the apertures 70 or 72.

Figure 7A:
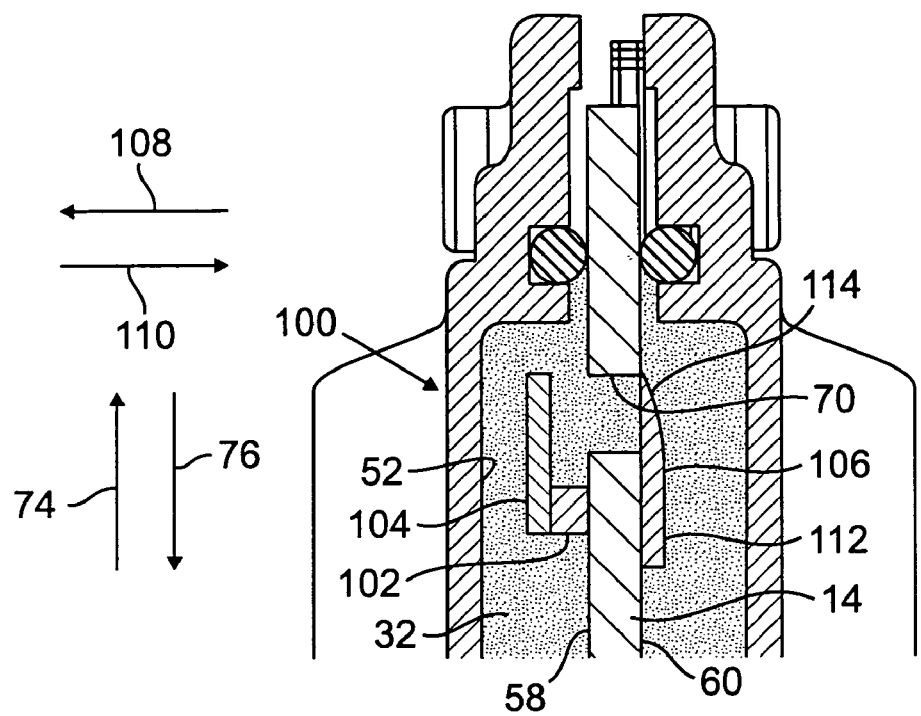
FIGS. 7A and 7B show enlarged fragmentary cross sectional view of the arrangement of of FIG. 1 that illustrate the construction and operation thereof.
Figure 7B:
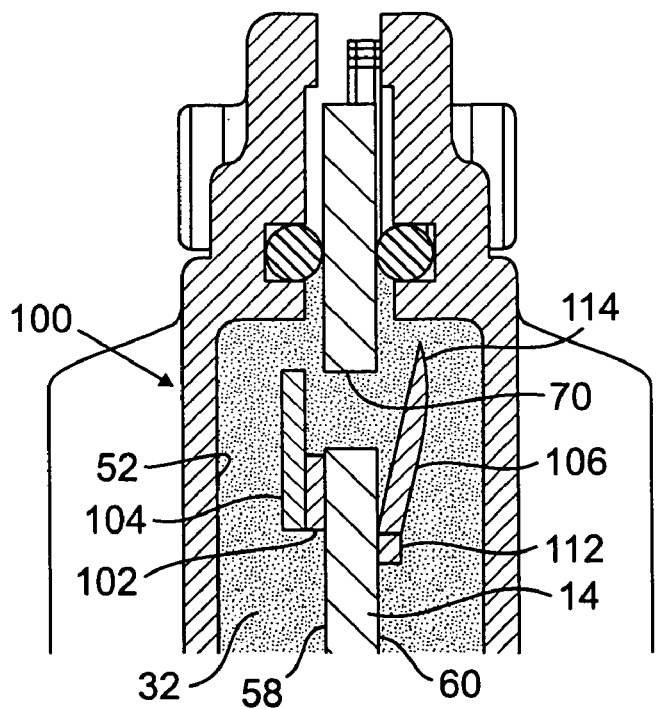

As discussed above, each of the electromechanical actuators 100 is disposed proximate one of the apertures 70 or 72. FIGS. 7A and 7B show one exemplary electromechanical actuator 100 disposed proximate an exemplary aperture 70. With reference to FIG. 7A, the piezoelectric actuator 102 is preferably secured to the first surface 58 of the primary circuit board portion 16 adjacent to the aperture 70. The blade 104 is coupled to the piezoelectric actuator 102 and extends therefrom over the aperture 70 such that it is displaced from the aperture 70 in the direction indicated by arrow 108. The flapper valve 106 is secured at a first end 112 to the second surface 60 of the primary circuit board portion 16. The second end 114 of the flapper valve 106 is disposed proximate to the aperture 70 such that the second end 114 may, under certain circumstances discussed further below, close off the aperture 70 (see also FIG. 7B).

Referring generally again to FIGS. 1, 2, 3, 4, 5, 6, 7A and 7B, the remaining electromechanical actuators 100 have a similar construction. It is noted, however, that the piezoelectric actuator 102 and the blade 104 of the electromechanical actuators proximate the upper apertures 70 are located in the first subcompartment 52 while the piezoelectric actuator 102 and the blade 104 of the electromechanical actuators 100 proximate the lower apertures 72 are located in the second subcompartment 54.

The first electronic component 30 is an electronic device that generates heat during operation and may be liquid cooled. The second electronic component 34 is a device that is not amenable to liquid cooling, such as, for example, an optical transmitter. The first electronic component 30 is secured to the primary circuit board portion 16 such that the first electronic component 30 is located on the first surface 58 of the circuit board 14. For reasons that will be discussed in further detail below, it is preferable to place all of the circuit components in the primary circuit board portion 16 on one side of the circuit board 14, or in other words on the first surface 58. In any event, the second electronic component 34 is similarly secured to the secondary circuit board portion 18 such that the second electronic component 34 is also located on the first surface 58 of the circuit board 14.

It should also be appreciated that, since the first electronic component 30 is secured to the primary circuit board portion 16, the first electronic component 30 is also located within the compartment 28. In particular, the first electronic component 30 is located within the first subcompartment 52 of the compartment 28. It should further be appreciated that the above described arrangement locates the secondary circuit board portion 18 outside of the compartment 28. Furthermore, since the second electronic component 34 is secured to the secondary circuit board portion 18, the second electronic component 34 is located outside of the compartment 28.

Nevertheless, as shown in FIG. 4, the first electronic component 30 is electrically coupled to the second electronic component 34 via at least one conductive trace 56. A segment of the trace 56 is interposed between the first surface 58 and the second surface 60 of the circuit board 14 while each end of trace 56 extends through first surface 58 so as to be electrically interfaced either directly or indirectly with the first electronic component 30 and the second electronic component 34. It should be appreciated that, while only first electronic component 30 and second electronic component 34 are shown electrically coupled via a trace interposed between the first surface 58 and the second surface 60 of the circuit board 14, several of the electronic components located within the compartment 28 may be electrically coupled to electronic components located outside of the compartment 28 (i.e. on secondary circuit board portion 18) utilizing similar traces interposed between the first surface 58 and the second surface 60 of the circuit board 14.

Attaching the first plate member 22 and the second plate member 24 to each other as previously described results in the first wall segment 42 and the second wall segment 44 cooperating so as to define a cavity 46 as clearly shown in FIGS. 2, 3, and 4. The secondary circuit board portion 18 is positioned within cavity 46. Moreover, since the second electronic component 34 is attached to the secondary circuit board portion 18, the second electronic component 34 is also positioned within the cavity 46.

As shown in FIGS. 2 and 4, a liquid 32 is disposed within the compartment 28 via a port (not shown) defined in the first plate member 22. Preferably, the liquid 32 is disposed within the compartment 28 such that the liquid 32 is in direct contact with all of the electronic components secured to the primary circuit board portion 16. To this end, the enclosure member 20 includes a rotatably insertable fluid stop 29 that fits into an aperture in the first plate member 22. After the first plate member 22 and the second plate member 24 are secured to each other as described above, the liquid 32 is disposed into the compartment 28 through the aperture. The fluid stop 29 is then secured into the aperture to enclose the liquid 32 in the compartment 28.

As shown in FIG. 4, the liquid 32 is in direct contact with the first electronic component 30. It should be understood that the liquid 32 can pass through upper apertures 70 and lower apertures 72 such that both the first subcompartment 52 and a second subcompartment 54 of the compartment 28 are nearly full of liquid 32. Preferably, the liquid 32 is a cooling fluorocarbon liquid, such as the commercially available product Fluorinert FC-77, which is available from Minnesota Mining & Manufacturing, Inc.

As depicted in FIG. 4, the cavity 46 allows a gas 36, such as air, to come into direct contact with the electronic components (e.g. second electronic component 34) attached to the secondary circuit board portion 18.

During use of the arrangement 10, the electronic components attached to the circuit board 14 generate a significant amount of heat. However, this heat is effectively managed by the advantageous design features of the present invention. In general, the liquid 32 transfers heat from the electronic components towards the enclosure member 20. The enclosure member 20, which is preferably constructed of a heat conducting material such as aluminum, conducts heat to the fins 48 thereon. The fins 48 provide a substantial amount of surface area for the heat to dissipate.

In addition, in accordance with the present invention, a least some portions of the liquid 32 circulate through the compartment 28, thereby enhancing the heat exchange between the electronic components attached to primary circuit board portion 16 and the enclosure member 20. In particular, because most, if not all, of the electronic components are secured to the primary circuit board portion 16 on the first surface 58 of the circuit board 14, most of the heat generating elements are positioned within the first subcompartment 52. Because most of the heat generating elements are positioned within the first subcompartment, the temperature of the liquid 32 located in the first subcompartment 52 will typically be higher than the liquid 32 located in the second subcompartment 54.

As a result, a temperature gradient is established between the liquid 32 located in the first subcompartment 52 and the liquid 32 located in the second subcompartment 54. In general, the apertures 70 provide a point of egress for the relatively warm liquid to escape the first subcompartment 52 and thus dissipate the heat from the electronic components further away from the circuit board 14.

In the embodiments discussed herein, the liquid 32 circulates between the first subcompartment 52 and the second subcompartment 54 through the upper apertures 70 and the lower apertures 72. In particular, the upper apertures 70 allow movement of liquid from the first subcompartment 52 to the second subcompartment 54 and the lower apertures allow movement of liquid from the second subcompartment 54 to the first subcompartment 52.

During use, the electronic assembly 12 is vertically oriented as shown in FIGS. 5 and 6. As discussed above, the electronic components (such as the electronic component 30) in the first subcompartment 52 generate a substantial majority of the heat energy generated by the electronic circuit 12. As a result, at least a portion of the liquid 32 that is located in the first subcompartment 52 absorbs a large amount of heat energy from the circuit 12 because that liquid has a large amount of surface area contact with the various heat-generating electronic components. As a consequence, this portion of the liquid 32 will be at a higher temperature than the portion of the liquid 32 in the second subcompartment 54.

Because the tendency of relatively warm liquid is to rise, the relatively warm liquid 32 located in the first subcompartment 52 will rise in the direction indicated by arrows 74 (see FIGS. 5 and 6). As more of the liquid 32 rises, some of the liquid 32 advances through the upper apertures 70 and into the second subcompartment 54.

Consequently, because the tendency of relatively cool liquid is to sink, the relatively cool portion of liquid 32 located in the second subcompartment 54 will sink in the direction indicated by arrows 76 (see FIGS. 5 and 6). The downward movement of the relatively cool portion of liquid 32 is assisted by the influx of relatively warm liquid 32 at the upper apertures 70. As the relatively cool liquid 32 located in the second subcompartment 54 sinks in the above described manner, the liquid 32 is advanced through the lower apertures 72 and thus enters the first subcompartment 52.

Once located in the second subcompartment 54, the relatively warm portion of the liquid 32 begins to cool because little or no heat generating electronic components are located within second subcompartment 54 and the heat may be dissipated through the fins 48 of the second plate member 24. Similarly, once located in first subcompartment 52, the relatively cool liquid 32 begins to warm and thus rise as it comes into contact with the heat generating electronic components located within the first subcompartment 52.

Accordingly, the above-described convection action causes at least some circulation of the liquid 32 between the first subcompartment 52 and the second subcompartment 54. This continuous circulation of the liquid 32 significantly enhances the heat exchange relationship between the electronic components located within the compartment 28 and the liquid 32, as discussed in U.S. Pat. No. 6,304,447, which is assigned to the assignee of the present invention and incorporated herein by reference. In accordance with the present invention, however, the electromechanical actuators 100 operate to enhance the circulation of the liquid 32 between the first subcompartment 52 and the second subcompartment 54, thereby improving the heat dissipation from the heat-generating electronic components.

In particular, the circulation of the liquid 32 is enhanced or assisted by the electromechanical devices 100 because each of the electromechanical device 100 generates a flow movement of the liquid 32 in the direction of one or more of the apertures 70 or 72. In particular, the electromechanical devices 100 located proximate the upper apertures generate a flow movement to assist the liquid flow from the first subcompartment 52 through aperture 70 to the second subcompartment 54, and the electromechanical devices 100 located proximate the lower apertures 72 generate a flow movement to assist the liquid flow from the second subcompartment 54 through the apertures 72 to the first subcompartment 52.

FIGS. 7A and 7B illustrate the exemplary electromechanical actuator 100 in two operational positions that illustrate the operation of the electromechanical actuator 100 in accordance with the present invention. In general, when a suitable electric signal is applied to the piezoelectric actuator 102, the piezoelectric actuator 102 changes its shape in an alternating manner. An exemplary electrical signal would be an alternating square wave signal. The alternating shape change causes the blade 104 to move back and forth in the directions shown by arrows 108 and 110. The movement of the blade 104 would nominally generate a fluid flow in both of the directions indicated by the arrows 108 and 110. The flapper valve 106, however, is configured to allow flow of liquid only in the direction shown by arrow 108 through the aperture 70. As a result, the movement of the blade 104 enhances fluid flow from the first subcompartment 52 to the second subcompartment 54 but not vice versa.

In particular, a 0.1 to 10 Hz square wave input signal is preferably provided to the piezoelectric actuator 102 via the primary portion of the circuit board 16. When the square wave input signal is in the low magnitude portion of the duty cycle, the piezoelectric actuator 102 assumes a nominal shape as shown in FIG. 7A.

When the square wave transition to it high magnitude portion of the duty cycle, the piezoelectric actuator 102 changes shape such that its dimensions along arrows 74 and 76 increase and its dimensions along arrows 108 and 110 decrease, as shown in FIG. 7B. As a result of the decrease of the dimension of the piezoelectric actuator 102 along arrows 108 and 110, the blade 104 moves in the direction 110. Such movement of the blade 104 generates a fluid flow through the aperture 70 in the direction shown by arrow 110. Such fluid flow cause the flapper valve 106 to flex such that the second end 114 of the flapper valve 106 moves away from the aperture 70 generally in the direction shown by arrow 110, as shown in FIG. 7B. As a result, the liquid 32 flows from the first subcompartment 52 through the aperture 70 to the second subcompartment 54.

When the square wave input signal transitions back to its low magnitude portion of the duty cycle, the piezoelectric actuator 102 changes shape such that its dimensions along arrows 74 and 76 decrease and its dimensions along arrows 108 and 110 increase, as shown in FIG. 7B. As a result of the increase of the dimension of the piezoelectric actuator 102 along arrows 108 and 110, the blade 104 moves in the direction 108.

It is noted that such movement of the blade 104 could tend to generate a fluid flow through the aperture 70 in the direction shown by arrow 108. However, no appreciable amount of liquid 32 flows from the second subcompartment 54 to the first subcompartment 52 through the aperture 70 for two reasons. First, it is noted that the passive convection current of the arrangement 10, which urges fluid through the upper aperture 70 in the direction of the arrow 110 as discussed further above, tends to negate any opposite fluid flow. Second, to the extent that the flow generated by the movement of the blade 104 can cause fluid flow through the upper aperture 70 in the direction shown by the arrow 108, such fluid flow causes the second end 114 of the flapper valve 106 to be drawn to and against the upper aperture 70 such that the second end 114 closes off the aperture 70, thereby preventing significant amounts of fluid flow therethrough.

As a result, the electromechanical actuator 100 generates a flow of the liquid 32 from the first subcompartment 52 through the aperture 70 to the second subcompartment 54. The generated flow assists or enhances the inherent convection flow of the liquid 32 discussed further above.

The electronic components located in a gaseous environment, i.e. those electronic components attached to secondary circuit board portion 18, are in a heat exchange relationship with gas 36, e.g. air. These components are effectively cooled by air convection cooling.

The above described combination of cooling some of the electronic components attached to the circuit board 14 with liquid 32 (e.g., the first electronic component 30) while cooling other electronic components attached to the circuit board 14 with gas 36 (e.g., the second electronic component 34) may effectively maintain the temperature of the electronic assembly 12 within acceptable limits without any assisted cooling (i.e. fans).

It will be noted that the heat dissipation provided by the present invention is plainly applicable to dissipating heat from any heat-generating elements on the circuit board, and not just electronic components.

The arrangement 10 of the present invention also allows electronic components which have different abilities to tolerate heat to be attached to the same circuit board. Consider a situation in which the first electronic component 30 is an integrated circuit and the second electronic component 34 is an optoelectronic device. The integrated circuit device is typically capable of tolerating a greater amount of heat than the optoelectronic device. The arrangement 10 of the present invention allows both of these electronic components to be secured to a single circuit board, i.e. circuit board 14, while substantially isolating the optoelectronic device from the relatively hot environment in which the integrated circuit devices operate. This isolation is achieved by locating heat tolerant electronic components (e.g., the first electronic component 30) within the compartment 28, while locating electronic components which are relatively heat sensitive (e.g., the second electronic component 34) outside of the compartment 28, away from the heat tolerant electronic components. The ability to locate both heat tolerant and heat sensitive electronic components on a single circuit board is advantageous because the resulting circuit benefits from better electrical connections inherent in single board construction.

The present invention thus provides significant advantages over designs that do not allow gas cooled and liquid cooled electronic components on the same circuit board. These types of designs typically include at least one or more circuit boards having electronic components thereon being cooled in a gaseous environment, and other circuit boards having electronic components thereon being cooled in a liquid environment. Specifically, the circuit boards cooled in a liquid environment are typically completely housed in a box filled with a cooling liquid. These designs electrically interconnect the gas cooled electronic components to the liquid cooled electronic components utilizing special insulated feedthroughs which must extend through a wall of the box so as to interface with the liquid cooled electronic components contained therein. These feedthroughs always introduce a large impedance discontinuity in the signal path, thereby limiting the bandwidth that can be transmitted. In addition, these designs suffer from the problem of leakage of the cooling liquid at the point where the feedthrough penetrates the box wall. The present invention avoids the aforementioned problems by disposing the liquid cooled electronic components and the gas cooled electronic components on a single circuit board (i.e., circuit board 14) and coupling the liquid and gas cooled electronic components via traces interposed between first surface 58 and second surface 60 of circuit board 14.

It will be appreciated that the advantages of the present invention provided by the inclusion of electromechanical actuators 100 in the arrangement of the present invnetion may be obtained in alternative embodiments that do not include a portion of the circuit board 14 that extend outside the compartment 28. In other words, many of the heat dissipation advantages of the present invention may be obtained without employing both gas-cooled and liquid-cooled elements on the same circuit board. Moreover, such advantages may be obtained in embodiments that do not employ the circuit board 14 as part of the overall fluid tight barrier.

Similarly, the exact configuration of the upper and lower apertures 70, 72 is not critical to obtain the benefits of circulation of the liquid 32 provided thereby. At least some additional advantages, however, are provided by location the upper apertures 70 proximate to the top end of the electronic assembly 12. In particular, the tendency of the heated portion of the liquid 32 to rise advances the heated portion of the liquid toward such upper apertures 70. However, even such additional advantages may be obtained through any suitable number of apertures 70 located in any position proximate to the upper end of the electronic assembly.

Figure 8A:
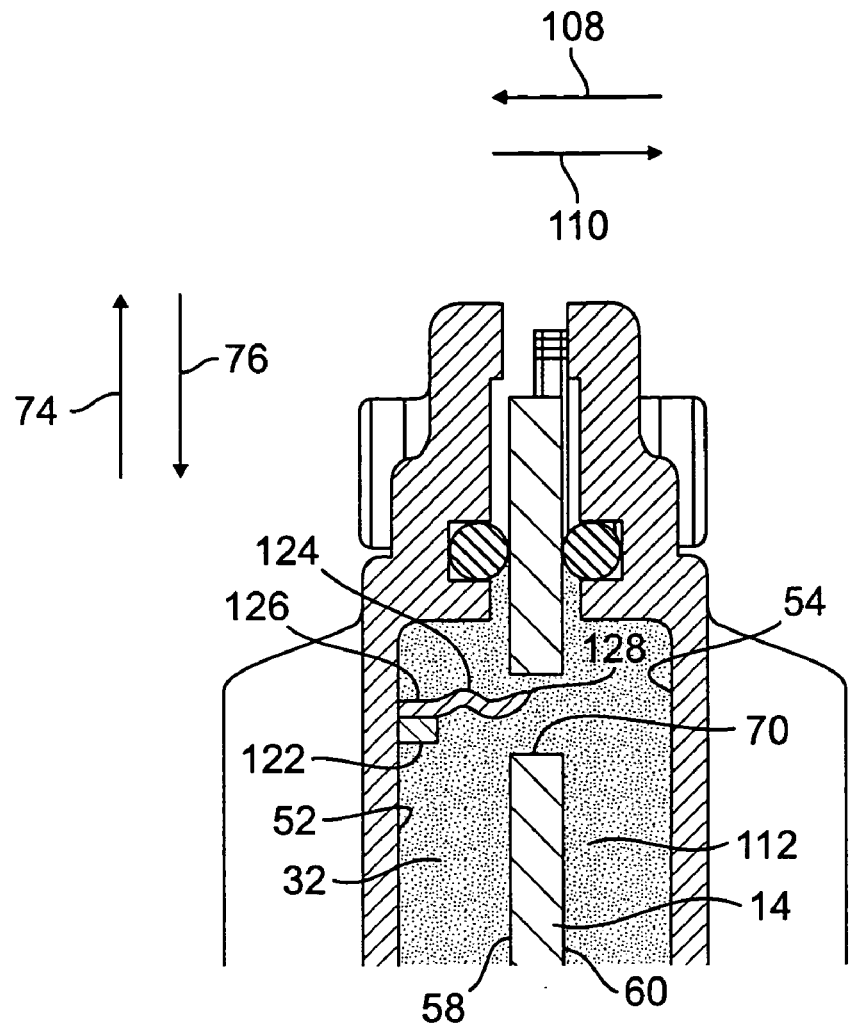
FIG. 8A shows a first alternative arrangement for cooling an electronic assembly in accordance with the present invention.
Figure 8B:
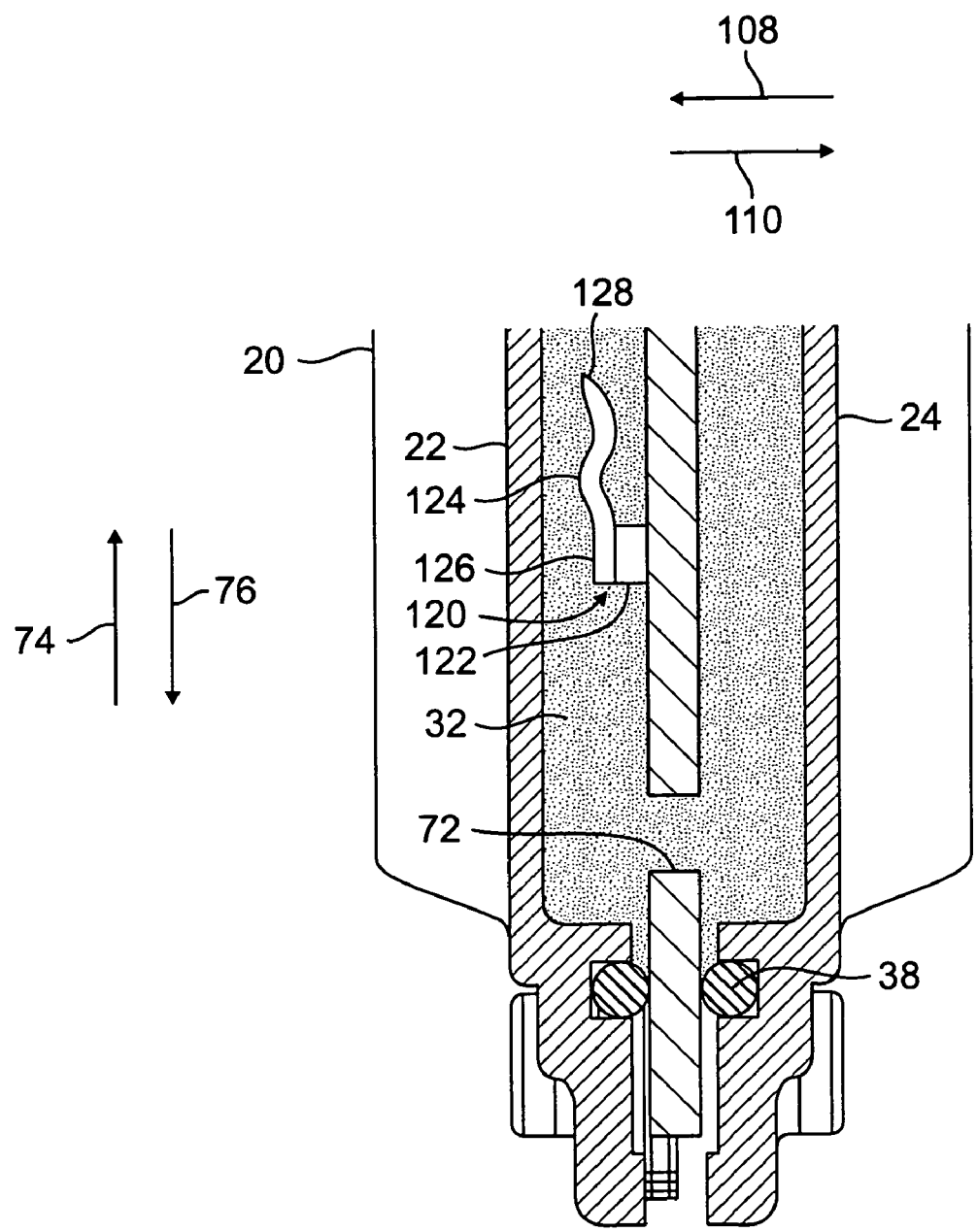
FIG. 8B shows a second alternative arrangement for cooling an electronic assembly in accordance with the present invention.

In addition, the benefits of electromechanical actuators to generate a fluid flow in a circuit enclosure are not limited to the embodiment shown in FIGS. 1, 2, 3, 4, 5, 6, 7A and 7B. FIGS. 8A and 8B, for example, show two alternative embodiments of the present invention. The alternative embodiments of FIGS. 8A and 8B are based largely on the embodiment described above in connection with FIGS. 1 through 7B. In particular, each of the alternative embodiments of FIGS. 8A and 8B constitutes the arrangement 10 of FIGS. 1 through 7B wherein the electromechanical actuator 100 is replaced with an alternative electromechanical actuator 120.

Figure 9:
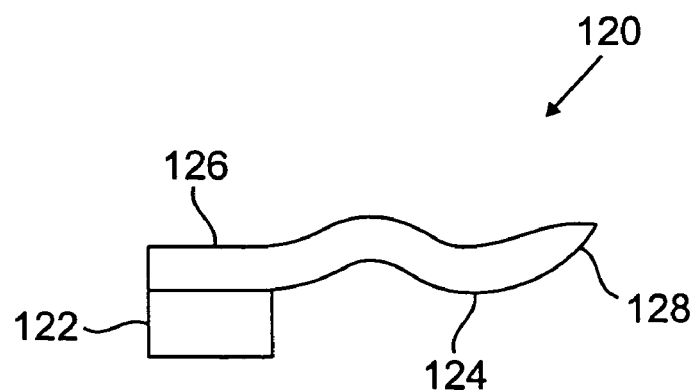
FIG. 9 shows an exemplary electromechanical actuator that may be used in the first and second alternative arrangements of FIGS. 8A and 8B.

The alternative electromechanical actuator 120 employed in the embodiments in FIGS. 8A and 8B is shown removed from the arrangement 10 in FIG. 9. As shown in FIG. 9, the alternative electromechanical actuator 120 includes a peizoelectric actuator 122 and a flexible blade 124. The flexible blade 124, unlike the blade 104 of FIGS. 6, 7A and 7B, is capable of elastic deformation. More particularly, the flexible blade 124 includes a first end 126 couple to the piezoelectric actuator 122 and a second end 128 cantilevered therefrom. The flexible blade 124 should be constructed of a polymeric material that is chosen to have elastic properties such that the second end 128 flexes due to the resisting force of the liquid 32 against the second end 128 when the first end 126 moves. Those of ordinary skill in the art may readily determine the appropriate material based on the thickness and length of the flexible blade 124.

FIG. 8A is a partial cutaway view, similar to the view of FIGS. 7A and 7B, of the arrangement 10 of the present invention in which the electromechanical actuator 100 is replaced by the electomechanical actuator 120 in a first configuration. In the embodiment of FIG. 8A, the electromechanical actuator 120 is secured within the first subcompartment 52 such that the flexible blade 124 extends in a direction from the piezoelectric actuator 122 that has an axial component with respect to the aperture 70. For example, the flexible blade 124 may suitably extend toward the aperture 70 substantially along the axial line running through the center of the aperture 70. To this end, the piezoelectric actuator 122 may suitably be coupled to the first plate member 22 opposite the aperture 70.

In such a case, it is noted that wire leads, not shown, must be provided from the signal source, not shown, on the circuit board 14 to the piezoelectric actuator 122. It is noted that, in the alternative, the piezoelectric actuator 122 may be coupled to a support, not shown, that extends from the circuit board 14. In such a case, the wire leads may be disposed on or within the support.

In any event, during normal operation, the arrangement 10 develops a normal convection current as described above in connection with FIGS. 1–7B. In addition, however, the electromechanical actuator 120 generates a flow movement in the direction of the aperture 70 that supplements the convection current.

In particular, a square wave input signal at a relatively low frequency, for example, below 60 Hz, is preferably provided to the piezoelectric actuator 122 via the primary portion of the circuit board 16. The piezoelectric actuator 122 behaves in much the same manner as the piezoelectric actuator 102 of FIGS. 7A and 7B. Namely, when the square wave input signal is in the low magnitude portion of the duty cycle, the piezoelectric actuator 122 assumes a nominal shape, and when the square wave transitions to it high magnitude portion of the duty cycle, the piezoelectric actuator 102 changes shape such that its dimensions along arrows 108 and 110 increase and its dimensions along arrows 74 and 76 decrease.

The constant transitions between the low and high magnitude portions of the duty cycle in the square wave input signal cause the piezoelectric actuator 122 to vibrate the first end 126 of the flexible blade 124 back and forth along the directions of arrows 74 and 76. As the first end 126 vibrates, the second end 128 attempts to follow in a "whipping" movement. The back and forth whipping movement of the second end 128 creates a flow gradient in the axial direction of the aperture 70 (i.e. direction 110), thereby assisting the flow of the liquid 32 through the aperture 70.

As a result, the electromechanical actuator 120 generates a flow of the liquid 32 from the first subcompartment 52 through the aperture 70 to the second subcompartment 54. The generated flow assists or enhances the inherent convection flow of the liquid 32 discussed further above. It is noted that one or more additional electromechanical actuators similar to electromechanical actuator 120 may be disposed in the second subcompartment 54 proximate to one or more lower apertures 72. Such electromechanical actuators would generate a flow of the liquid 32 from the second subcompartment 54 through the lower apertures 72 to the first subcompartment 52, thereby further enhancing the circulation of the liquid 32.

FIG. 8B shows a partial cutaway diagram of the arrangement 10 representing an enlarged view of the bottom portion of FIG. 6 wherein the electromechanical actuator 100 has been replace with the electromechanical actuator 120 of FIG. 9 in a second configuration. In the second configuration, the piezoelectric actuator 122 is secured within the first subcompartment 52 below the aperture 70 (not shown in FIG. 8B) and the flexible blade 124 extends in the direction toward the upper end of the circuit board 14. To this end, the piezoelectric actuator 122 is preferably coupled directly to the circuit board 14.

During normal operation, the arrangement 10 develops a normal convection current as described above in connection with FIGS. 1–7B. In addition, however, the electromechanical actuator 120 generates an upward flow movement that supplements the convection current. In particular, because the electromechanical actuator 120 is located below the upper apertures 70, the upward flow movement does assist the flow in the direction of the upper apertures 70.

To generate the flow movement, a square wave input signal at a relatively low frequency, for example, below 60 Hz, is preferably provided to the piezoelectric actuator 122 in the same manner as that described above in connection with FIG. 8A. As described above, the piezoelectric actuator 122 generates a vibration or pulsation movement. In contrast to FIG. 8A, however, the electromechanical actuator 120 is configured such that the flexible blade extends upward in the direction of the arrow 74, and not in the direction of the arrow 110. Accordingly, the movement of the piezoelectric actuator 122 vibrates the first end 126 of the flexible blade 124 back and forth along the directions of arrows 108 and 110. As the first end 126 vibrates, the second end 128 attempts to follow in a "whipping" movement. The back and forth whipping movement of the second end 128 acts as a propeller that creates a flow gradient in the upward direction, thereby assisting the flow of the liquid 32 towards the aperture 70.

Accordingly, in the embodiments of the present invention that incorporate an electromechanical actuator similar to the electromechanical actuator 120 require less components than the embodiments that incorporate the electromechanical actuator 100. Moreover, the embodiment shown in FIG. 8B does not require location of the electromechanical actuator 120 proximate the aperture, which advantageously increases flexibility in the layout of the circuit board 14. It is noted that one or more electromechanical actuators similar to the electromechanical actuator 120 may be disposed in the second subcompartment 54 as well, or in the alternative. Such electromechanical actuators disposed in the second subcompartment 64, however, should be disposed above the lower apertures 72 and arranged such that their respect flexible blades nominally extend in the downward direction indicated by the arrow 76. Such actuators would then generate a flow movement of the liquid 32 that would assist the movement of the liquid 32 in the second subcompartment 54 downward and toward the lower apertures 72.

Figure 10:
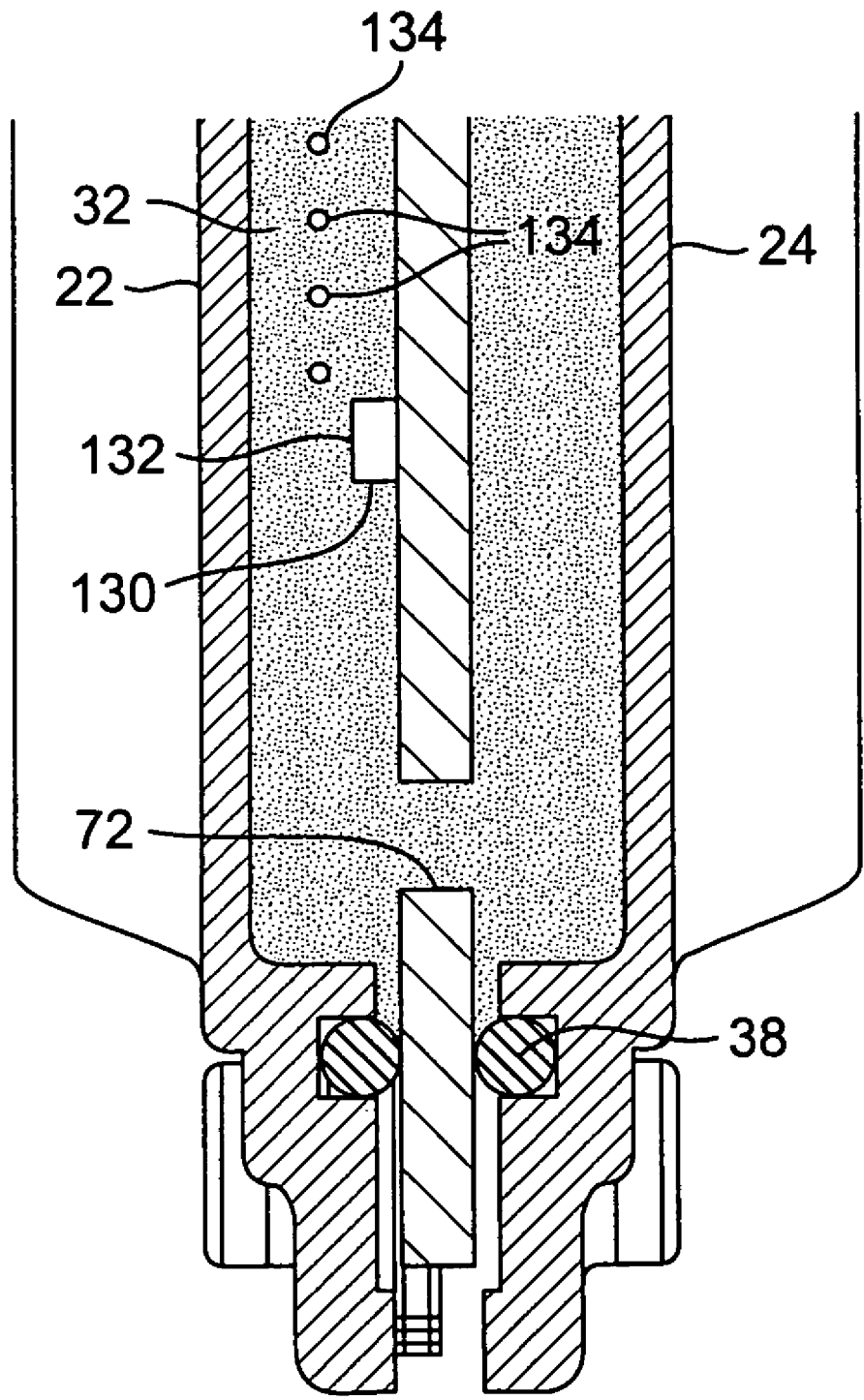
FIG. 10 shows an enlarged fragmentary cross sectional view of a third alternative arrangement for cooling an electronic assembly according to the present invention.

FIG. 10 shows yet another embodiment of the arrangement 10 of FIGS. 1–7B wherein the electromechanical actuator 100 has been replaced with an electromechanical actuator 130. In particular, FIG. 10 shows a partial cutaway diagram of the arrangement 10 representing an enlarged view of the bottom portion of FIG. 6 wherein the electromechanical actuator 100 has been replace with the electromechanical actuator 130. As shown in FIG. 10, the electromechanical actuator 130 comprises a piezoelectric actuator 132. The piezoelectric actuator 132 is secured within the first subcompartment 52 below the aperture 70 (not shown in FIG. 10).

In the embodiment of the arrangement 10 that employs the electromechanical actuator 130, the arrangement 10 generates a flow of the liquid using cavitation. In other words, the electromechanical actuator 130 operates to form gas or vapor filled cavities 134 within the liquid 32 that contributed to the upward flow in the first subcompartment 52.

In particular, an oscillating signal is provided to the piezoelectric actuator 132. The oscillating signal preferably has a frequency that exceeds that applied to the piezoelectric actuators 102 and 122, discussed above. The piezoelectric actuator 132 changes it shape in conjunction with the high and low swings of the oscillating signal, as is known in the art. The alternating shape change produces the mechanical vibration that causes cavitation. Cavitation is increased with the frequency of the vibration. As a result, it may be preferable to generate a cavitation signal that has a relatively high frequency. Because many piezoelectric actuators have resonant frequency in the range of about 15 kHz to 40 kHz, it may be preferable to drive the piezoelectric actuator 132 with its resonant frequency, thereby generating a favorable displacement to input energy ratio.

The cavitation action forms the gas or vapor filled cavities 134, which tend to rise in the liquid 32. The rising vapor filled cavities 134 generate an upward flow force that contributes to the existing convection current toward the upper end of the compartment 28. Accordingly, the cavitation action generated by the piezoelectric actuator 132 generates a flow of the liquid 32 toward the upper aperture 70, thereby increasing the circulation of the liquid 32.

It is noted that the electromechanical actuator 130 may further include a blade, not shown, coupled to the piezoelectric actuator 132 to increase the agitation of the liquid 32. However, the use of a blade would require additional assembly, and would require additional energy in operation. Those of ordinary skill in the art may readily determine whether the use of an additional blade on the cavitating electromechanical actuator 130 benefits their particular implementation.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the enclosure member 20 of the present invention need not comprise two opposing plate members as described above, but instead may be a single piece enclosure that cooperates with the circuit board 14 to form a fluid tight container.

We claim:

1. An arrangement for cooling an electronic assembly, the arrangement comprising:

a circuit board having a first surface, a second surface, and at least a first heat-generating element secured to the first surface, the circuit board further comprising at least one aperture extending between the first surface and the second surface;

an enclosure member secured to said circuit board so as to form a fluid tight barrier of a compartment defined at least in part by said enclosure member and said circuit board, said compartment including a first subcompartment defined at least in part by said first surface and said enclosure member and a second subcompartment defined at least in part by said second surface and said enclosure member;

a liquid disposed within said compartment;

at least one electromechanical actuator secured within the compartment, the electromechanical actuator operable to generate a flow movement of the liquid in the direction of the at least one aperture, the at least one mechanical actuator including a substantially rigid blade coupled to a piezoelectric actuator and extending in a first direction from the piezoelectric actuator, the piezoelectric actuator coupled proximate the at least one aperture; and a flapper valve having a first end secured within the second subcompartment proximate the at least one aperture and a second end movably coupled to the first end, the second end movable to alternately allow fluid flow throught the first aperture and inhibit fluid flow through the first aperture.

2. The arrangement of claim 1 wherein the circuit board includes an external portion that extends outward of the compartment.

3. The apparatus of claim 2 wherein the enclosure includes a plurality of cooling fins configured to convey heat from a fluid disposed within the compartment to an external environment.

4. The apparatus of claim 1 wherein the circuit board includes a top end portion and a bottom end portion, and wherein the top end portion includes at least one aperture extending between the first surface and the second surface and the bottom end portion.

5. The apparatus of claim 4 wherein the enclosure includes a plurality of cooling fins configured to convey heat from a fluid disposed within the compartment to an external environment.

6. The arrangement of claim 4 wherein the circuit board includes an external portion that extends outward of the compartment.

7. The apparatus of claim 6 wherein the enclosure includes a plurality of cooling fins configured to convey heat from a fluid disposed within the compartment to an external environment.

8. The apparatus of claim 1 wherein the enclosure includes a plurality of cooling fins configured to convey heat from a fluid disposed within the compartment to an external environment.

* * * * *